United States Patent [19]
Mihara

[11] Patent Number: 5,515,311
[45] Date of Patent: May 7, 1996

[54] METHOD OF DRIVING FERROELECTRIC MEMORY

[75] Inventor: Takashi Mihara, Iruma, Japan

[73] Assignee: Olympus Optical Co., Ltd., Tokyo, Japan

[21] Appl. No.: 278,892

[22] Filed: Jul. 22, 1994

[30] Foreign Application Priority Data

Jul. 26, 1993 [JP] Japan .................................. 5-183826

[51] Int. Cl.$^6$ .................................................. G11C 11/22
[52] U.S. Cl. ................................................ 365/145; 257/295
[58] Field of Search .................................... 365/117, 145; 257/295

[56] References Cited

U.S. PATENT DOCUMENTS

| 3,832,700 | 8/1974 | Wu et al. ................. | 365/145 |
| 5,198,994 | 3/1993 | Natori ....................... | 365/145 |
| 5,307,305 | 4/1994 | Takasu ...................... | 365/145 |
| 5,361,225 | 11/1994 | Ozawa ....................... | 365/145 |

FOREIGN PATENT DOCUMENTS

| 5-90532(A) | 4/1993 | Japan . | |
| 5-90532 | 4/1993 | Japan . | |
| 5-120866(A) | 5/1993 | Japan . | |
| 5-120866 | 5/1993 | Japan . | |
| 5-342850 | 12/1993 | Japan ..................... | 365/145 |

Primary Examiner—Joseph A. Popek
Attorney, Agent, or Firm—Frishauf, Holtz, Goodman, Langer & Chick

[57] ABSTRACT

A ferroelectric memory having a structure in which source and drain are formed on a semiconductor substrate, a ferroelectric thin film is formed on a channel region between the source and drain regions, and a ferroelectric gate transistor memory cell having a ferroelectric gate transistor structure including a gate electrode made of a conductive gate electrode, is arranged on the thin film. An X selection line (column) is connected to the gate of the memory cell, and a Y selection line (row line) is connected to the source and drain, or the column and row of the X and Y selection line are connected to the memory cell vice versa. The memory can be driven only by 1-transistor/1-cell without a pass gate transistor, and the data can be non-destructively read out by applying a voltage lower than the coercive voltage of the ferroelectric to the gate electrode, the source and drain.

18 Claims, 7 Drawing Sheets

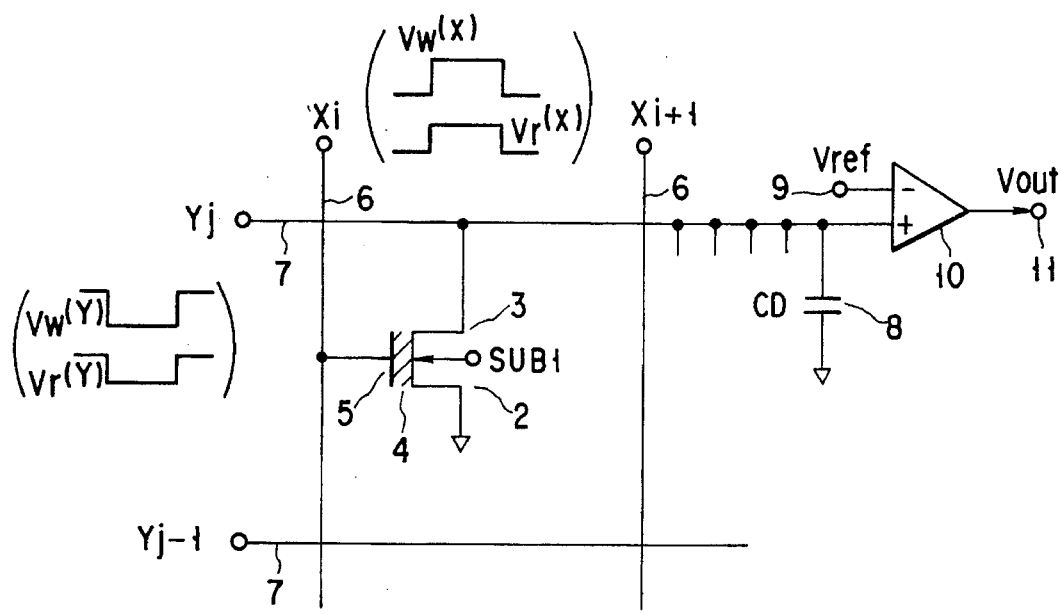
F I G. 1
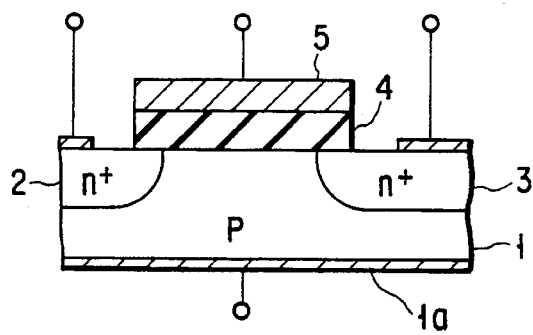
F I G. 2A
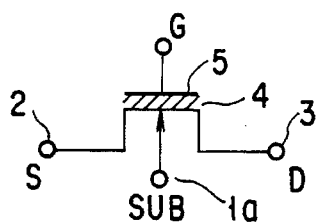
F I G. 2B
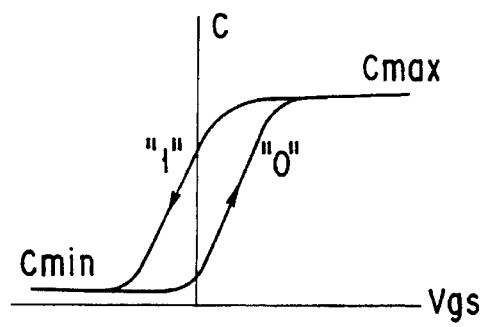
F I G. 2C

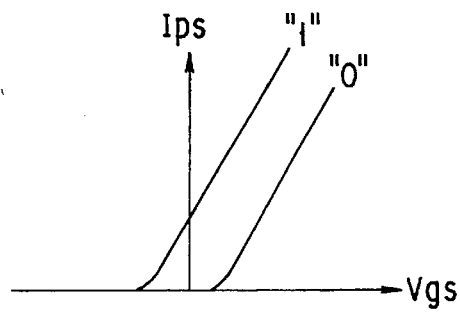
F I G. 4A
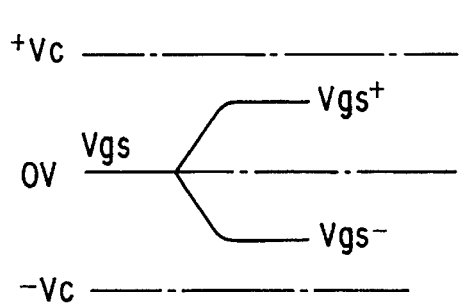
F I G. 4B
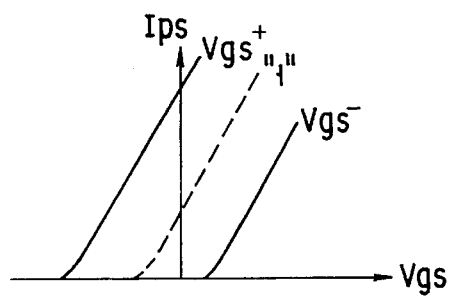
F I G. 4C
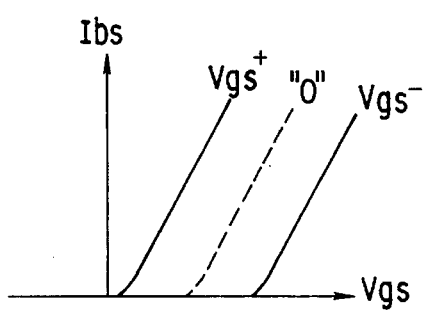
F I G. 4D
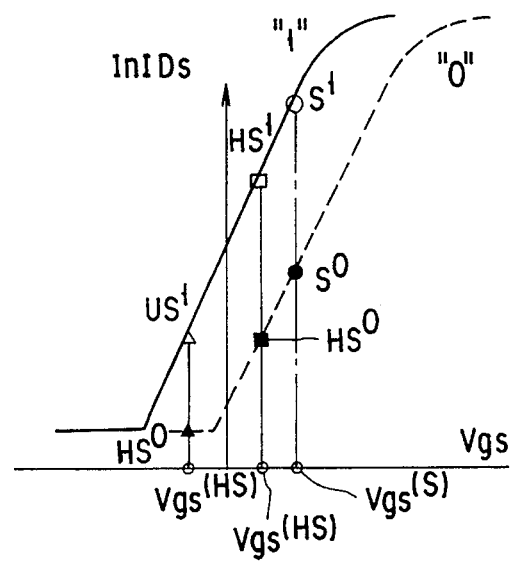
F I G. 4E

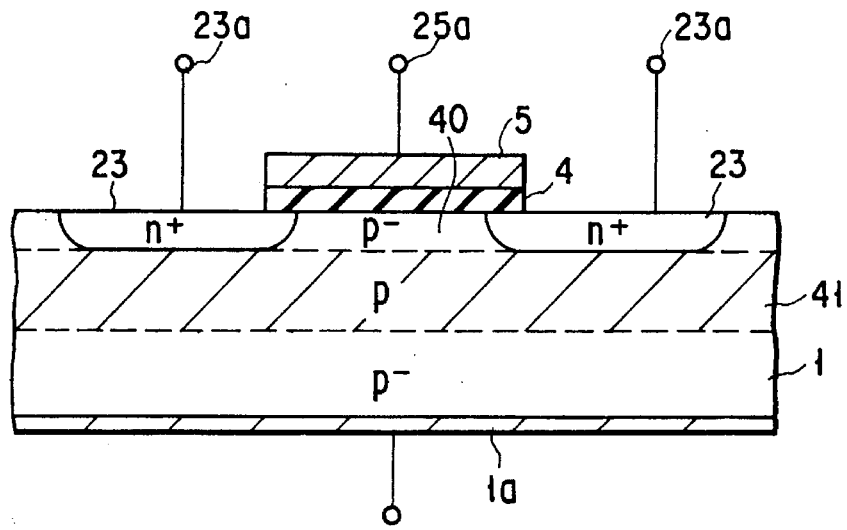
F I G. 9

METHOD OF DRIVING FERROELECTRIC MEMORY

BACKGROUND OF THE INVENTION

1. Field of the Invention

The present invention relates to a ferroelectric gate transistor memory and a method of driving a ferroelectric gate transistor memory, and specifically, to a non-destructive reading method of memory data.

2. Description of the Related Art

Conventionally, there are mainly two types of ferroelectric memories for recording data by utilizing a hysteresis characteristic of the ferroelectric material; the first one is a combination of a ferroelectric capacitor and a transistor for selecting its ferroelectric cell, and the second one is a type in which thin films made of a ferroelectric material are laminated on a semiconductor substrate so as to control the current and resistance.

The second type has a possibility of non-destructively reading out data stored in a memory cell.

This technique is discussed in "Chapter 5, Perspective of lamination technique for ferroelectric thin films and new device" Section 3, Ferroelectric Gate Non-volatile Memory FET-MFS-FET, Masanori OKUYAMA", and will be discussed with reference to FIGS. 10A, 10B and 10C.

In the structure, an n-type well region (not shown), a p-type source region 2, a drain region, a terminal thereof, a ferroelectric thin film 4 and a gate electrode 5 are formed on a semiconductor substrate 1. FIG. 10A shows a polarization state in which the polarization is downward, whereas FIG. 10B is the case where the polarization is upward. When the polarization is upward, a channel is formed as shown in FIG. 10B without applying a voltage to the gate, allowing a drain current to flow as illustrated in FIG. 10C. Such a device having a structure in which the gate of an FET is connected to the ferroelectric this film is called an F gate FET, hereinafter.

An example of a memory device which employs the F gate FET is that shown in FIG. 11, in which memory cells each consisting of combining an F gate FET and MOS-FET, are arranged in matrix (Jap. Pat. Appln. KOKAI Publication No. 5-120866), and another example is that shown in FIG. 12, in which a bit line is provided between the gate of an F gate FET and a ferroelectric member (see Jap. Pat. Appln. KOKAI Publication No. 5-90532).

However, the above-described types of F gate FETs shown FIGS. 10A and 10B, in spite of their advantages, entails the following three major drawbacks.

First, when a writing or erasing operation is performed by applying a voltage between the gate electrode 5 and the semiconductor substrate 1, the voltage must be very high.

Second, in order to select a desired F gate FET, a transistor for selection must be provided, causing an enlargement of the circuit, and resulting in enlargement of the area of the memory cell.

Third, in order to non-destructively read out data from a memory cell, it is necessary to apply a voltage on the source 2 and drain 3; however while applying the voltage on the source 2 and the drain 3, a voltage is inevitably applied between the gate electrode 5 and the source 2 and between the drain 3 and the gate electrode 5, thus erasing the polarization of the ferroelectric capacitor 4 in the memory cell as it repeats.

Meanwhile, the structure shown in FIG. 12 of Jap. Pat. Appln. KOKAI Publication No. 5-90532, is proposed to reduce the voltage for writing, and a word line (Xi word line) 6 and a bit line (Yj data line) 7 are provided in the ferroelectric capacitor 4, and a voltage is directly applied to the ferroelectric capacitor when writing data.

However, these KOKAI publications do not include a specific description of the method for writing or reading data, the biasing method, the selection method, or the sensing method when reading out of data. Nor do they disclose the structure of a memory which controls the potential difference between the source and drain.

Thus, the aforementioned three drawbacks have not been solved by the conventional techniques.

SUMMARY OF THE INVENTION

The present invention has been proposed in consideration of the above-described circumstances, and the object thereof is to provide a ferroelectric gate transistor memory and a method of driving a ferroelectric gate transistor memory which has such a high density that a single F gate FET is used in one cell, can carry out the reading of data at a voltage as low as 5 V or 3 V as used in general ICs or semiconductor memories, and serves as a non-volatile memory capable of non-destructive reading of data.

The present invention provides a method of driving a ferroelectric memory having a structure in which a second type source and drain region are formed on a first type semiconductor, a ferroelectric thin film is formed on a channel region between the source and drain regions, and a ferroelectric gate transistor memory cell having a ferroelectric gate transistor structure consisting of conductive gate electrodes, is arranged on the thin film in a matrix manner, the method comprising the steps of: applying a voltage lower than a coercive voltage of the ferroelectric between the gate electrode and the source, or between the gate electrode and the drain so that the voltage is applied to the maximum applied electric field area of the ferroelectric, and limiting a voltage created between the source and drain such that the maximum applied electric field area of the ferroelectric becomes lower than the coercive voltage.

Further, the present invention provides a method of driving a ferroelectric memory to non-destructively read out data therefrom, by selecting one memory cell from a simple matrix structure consisting of two terminals of the gate electrode and the source or drain.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram briefly illustrating a method of driving a ferroelectric memory, according to the present invention;

FIGS. 2A, 2B and 2C are diagrams showing structures and characteristic of the ferroelectric memory, designed to illustrate the driving method according to the first embodiment;

FIGS. 4A to 4E are diagrams illustrating the method of driving the ferroelectric memory, according to the first embodiment;

FIG. 9 is a diagram showing a lamination structure of a ferroelectric memory cell, designed to illustrate a method of driving a ferroelectric memory, according to the fifth embodiment;

DETAILED DESCRIPTION OF THE PREFERRED EMBODIMENTS

Figure 3A:
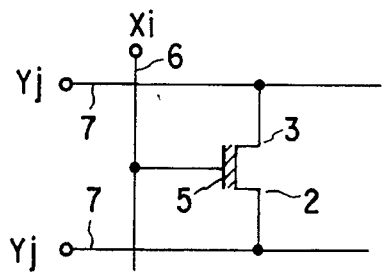
FIGS. 3A to 3F are diagrams illustrating the method of driving the ferroelectric memory, according to the first embodiment.

Embodiments of the present invention will now be described with reference to drawings.

First, the method of driving a ferroelectric memory, according to the present invention will be briefly described with reference to FIG. 1.

A memory cell of the ferroelectric memory used in the driving method of the present invention, employs a known F gate FET, and comprises a source 2, a drain 3, a ferroelectric capacitor 4 and a gate electrode 5.

In this embodiment, a word line (X word line) 6 is connected to the gate electrode 5, and a data line (Y data line) 7 is connected to the drain 3 of the F gate FET. With this structure, the source 2 is set at the GND level, and the semiconductor substrate, of which these elements are made, is fixed to the lowest potential of all the structural parts.

The Y data line 7 is grounded via a CD lead capacitor 8, and is also connected to an input terminal of an amplifier 10. The amplifier 10 detects the difference between a reference level (Vref) and a potential at the Y data line 7, and outputs the difference to an output terminal 11. The X word line 6 and the Y data line 7 constitute a simple X-Y matrix structure. Writing Pulses $V_w^{(x)}$ and $V_w^{(Y)}$ are voltages applied to the X word line 6 and the Y data line 7, respectively. Reading Pulses $V_r^{(x)}$ and $V_r^{(Y)}$ are voltages applied to the X word line 6 and the Y data line 7, respectively.

In the present invention, it is very important to set $V_w^{(x)}$, $V_w^{(Y)}$, $V_r^{(x)}$ and $V_r^{(Y)}$ to appropriate values, and with the appropriate values, writing and non-destructive reading of data can be achieved.

FIGS. 2A and 2B are diagrams respectively showing a structure of an F gate FET and a circuit structure, designed to illustrate a method of driving a ferroelectric memory according to the first embodiment of the present invention, and FIG. 2C is a diagram showing its CV characteristics.

The ferroelectric memory is a ferroelectric gate transistor memory cell (to be called memory cell hereinafter) 12 having a ferroelectric gate transistor structure as can be seen in FIGS. 2A and 2B. More specifically, source and drain regions 2 and 3, made of an $n^+$-type semiconductor, are formed on a p-type semiconductor substrate 1, a ferroelectric thin film 4 is formed on a channel region located between the source and drain regions 2 and 3, and a gate electrode 5, which is a conductive electrode, is formed on the film 4.

FIG. 2C shows a CV characteristic curve in the case where the gate electrode 5 is set to (+), and the semiconductor substrate 1 is set to (−). In this case, a voltage $V_{gsb}$ (between gate and substrate) must be set larger than a coercive voltage $V_C$ of this ferroelectric material so as to perform writing. When the semiconductor layer is in a charge accumulation state, that is, still in a negative charge, the capacity in the semiconductor layer is small, and therefore a voltage is not easily established. Consequently, a sufficiently large voltage must be applied.

Specifically, in the case where a negative voltage is applied so as to write "0", a voltage $V_f$ applied to the ferroelectric is obtained from $$V_f = \frac{C_s}{C_s + C_f} \cdot V_{gsb} \tag{1}$$

where $C_s$ represents the capacity of the semiconductor and $C_f$ represents the capacity of the ferroelectric.

$V_{gsb}$ is a voltage between the gate electrode 5 and the substrate electrode 1a.

Usually, a well region of the semiconductor substrate 1 has a concentration of $1 \times 10^{16}$ to $10 \times 10^{16}$ cm$^{-3}$, and the thickness of the depletion layer region is 0.3 μm to 1 μm. The dielectric constant of $\epsilon$ of silicon is 11.9 and that of the ferroelectric capacitor 100 to 1000, which is 10 to 100 times as high as that of silicon. Therefore, the following relationship was be established.

$$V_f = \frac{1}{30} \text{ to } \frac{1}{300} V_{gsb}$$

More specifically, since the writing voltage $V_w$ must be set such that a voltage applied to the ferroelectric exceeds the coercive voltage $V_C$, $V_{gsb}$ must be 30 to 300 times as high as $V_C$.

In the case where a positive voltage is applied to the gate electrode 5 for writing, the writing can be achieved substantially at a voltage of $V_C$ or higher, since there are a great number of free electrons in the channel. However, if a voltage (whose absolute value is) substantially as large as (that of) the negative voltage is applied, charge flows into the ferroelectric and/or an avalanche destruction occurs. Therefore, the writing voltage has a strong unbalance as $+V_C$ to −30 to −300 $V_C$.

Figure 3B:
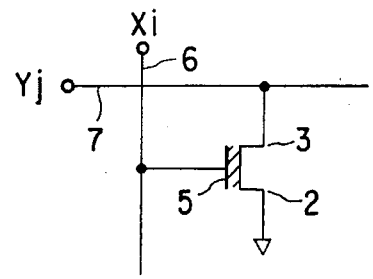

In the present embodiment, as shown in FIG. 3A, for example, the Xi word line 6 should be applied to the gate electrode 5, and the Yj data line 7 is applied to the source 2 and the drain 3 at the same time, or as shown in FIG. 3B, the Xi word line 6 is applied to the gate electrode 5, and the Yj data line 7 is applied to either one of the source 2 and the drain 3. The concentration of the p-well region should preferably be as low as possible, as long as the voltage proof can be maintained.

As will be described later, since a very high voltage is not applied to the source 2 or the drain 3 of the transistor, the concentration of the p-well region should preferably be about $10^{+14}$ to $10^{+16}$ cm$^{-3}$. In this case, when the source 2 and the drain 3 are set at the same potential, the source 2, the drain 3 and the region directly underneath the gate will have the same potential, or substantially the same potential with a difference of a built-in voltage of 0.6 to 0.8 v, because of a high resistance of the p-well region, despite that the leading electrode of the p-well region is fixed to the lowest potential in the IC. Thus, it is rendered possible to apply a similar voltage to the region directly underneath the gate electrode.

In this method, the source 2 and the drain 3 have a high concentration of electrons such as $1\times10^{21}$ to $10\times10^{21}$. When a negative voltage is applied and a depletion layer is created, its thickness is as small as several nanometers. Therefore, the capacity of the source-drains 2 and 3 becomes the same as or larger than that of the ferroelectric capacitor 4, and $V_w$ is twice as high as $V_C$.

Therefore, a writing voltage should preferably be applied to the gate electrode 5, the source 2 and the drain 3.

In FIG. 3A, the Xi word line 6 is applied to the gate electrode 5, and the Yj data line 7 is applied to both the source and drain of the F gate MOS, whereas in FIG. 3B, the X word line is applied to the gate electrode 5, and the Y data line 7 is applied to the drain 3 or the source 2, with the source 2 and drain 3 commonly connected (common terminal). To set up the common terminal is important to reduce the size of cell. With the above described structure, only the area disposed between the gate electrode 5 and the drain 3 is polarized for operation.

Figure 3C:
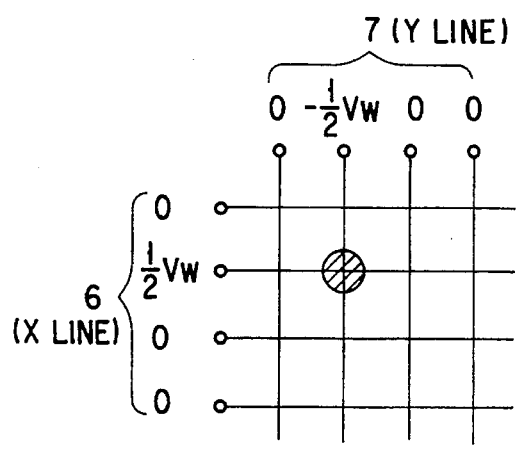
Figure 3D:
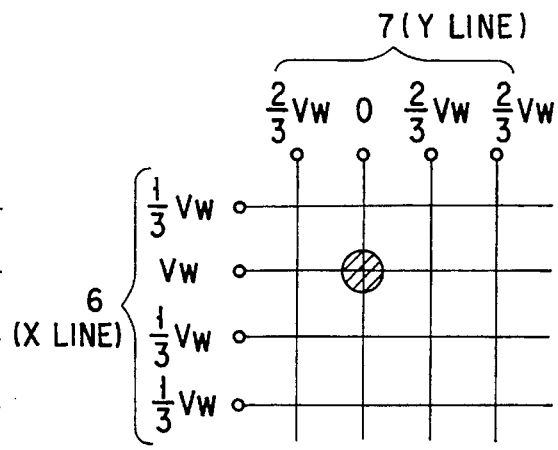

FIGS. 3C and 3D are diagrams illustrating the driving method. FIG. 3C shows a ½ $V_w$ mode, in which $V_w$, ½ $V_w$ and 0 V are respectively applied to a selected cell, a half-selected cell and a non-selected cell. Further, FIG. 3D shows a ⅓ $V_w$ mode, in which $V_w$ is applied to a selected cell, and ⅓ $V_w$ is applied to a half-selected cell and a non-selected cell.

Figure 3E:
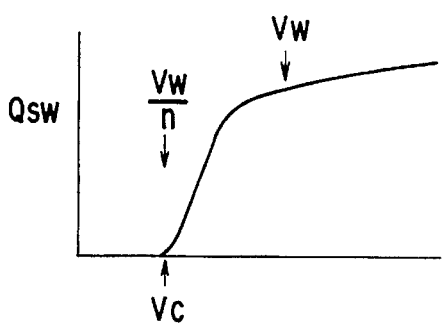
Figure 3F:
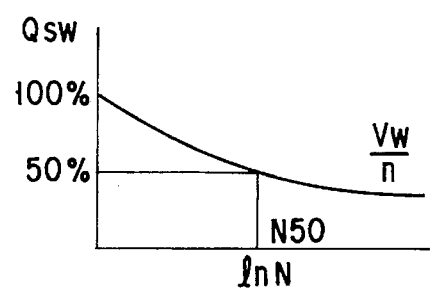

The setting of a voltage $V_w$ can be determined by the data shown in FIGS. 3E and 3F. FIG. 3E is the relationship between a switching charge potential $Q_{sw}$ and a pulse potential, and $V_w$ should preferably be used in a region having a saturated switching charge potential. FIG. 3F shows a so-called "latch of true $E_c$", which is a resistance to the disturbance pulse.

In FIGS. 3E and 3F, reference symbol n represents "2" in the ½ $V_w$ mode, and "3" in the ⅓$V_w$. FIG. 3F shows the deterioration characteristic of a switching charge $Q_{sw}$ in the case where a pulse of a voltage of $V_w/n$, which is the same as coercive voltage $V_C$ or less, is polarized in an opposite direction, and then applied n times. As shown in the figure, in the ferroelectric capacitor 4, even with $V_C$ or less, data stored in the capacitor (expressed in the form of voltage which creates polarization) is deteriorated when the application of the pulse is repeated $10^4$ to $10^6$ times, though the data is not deteriorated for 1 or 2 times of application of pulse.

Let us suppose now that the coercive voltage is preferably set to 1.0 V, and n=3, i.e. the ⅓ $V_w$ driving method, with $V_w$ being 1.5 V and $V_w/3$ being 0.5 V. In this case, as can be seen from FIG. 3F, the capacitor can withstand even $10^6$ times of repetitive disturbance pulse.

Next, the read out method will be described. The ferroelectric memory has the structure shown in FIG. 2A and the circuit shown in FIG. 1.

In the ferroelectric memory, the flat band voltage is obtained by $$V_{FB} = \phi_{MS} - \frac{Q_{FC}}{C_f}$$

where $\phi_{MS}$ represents a work relationship difference of metal electrode, and $Q_{FC}$ is a primary moment of the charge amount in the ferroelectric, that is, $$Q_{FC} = \int_{-d}^{0} \rho(y)(d+y)dy$$

where $\rho(y)$ is a distribution of a space charge amount, and y represents a coordinate(s) of the case where the interface of the ferroelectric and semiconductor is set at θ. In consideration of the polarization of the ferromagnetic having a remaining polarization of $P_r$, the following can be obtained.

$$V_{FB} = \phi_{MS} - \frac{Q_{FC}}{C_f} \pm \frac{P_r}{C_f}$$

The threshold voltage $V_{th}$ can be obtained by:

$$V_{th} = V_{FB} + 2\phi_F + \frac{\sqrt{2 \cdot \epsilon_s \cdot \epsilon_{fq} NA \cdot 2\phi_F}}{C_f} \pm \frac{P_r}{C_f}$$
$$= V_{th}^0 \pm \frac{2P_r}{C_f}$$

where $\phi$ represents a surface potential, and $\epsilon_s$ and $\epsilon_f$ represent the dielectric constants of silicon and ferroelectric, respectively.

Next, the source and drain currents can be expressed as:

$$I_d = A_{exp} \left\{ \frac{q}{kT} \left( V_g - V_{th}^0 \pm \frac{P_r}{C_f} \right) \right\}$$

$$l_n \cdot I_d = lnA + \left( \frac{q}{kT} \left( V_g - V_{th}^0 \pm \frac{P_r}{C_f} \right) \right)$$

$$V_g - V_{th}^0 \pm \frac{P_r}{C_f} = \frac{kT}{q} \cdot l_n \cdot I_d$$

where + and – indicate the directions of polarization. Therefore, the current in a polarization direction is expressed as:

$$I_d^{(+)} = A_{exp} \left\{ \frac{q}{kT} \left( V_{gs}^+ - V_{th}^0 \pm \frac{P_r}{C_f} \right) \right\}$$

$$I_d^{(-)} = A_{exp} \left\{ \frac{q}{kT} \left( V_{gs}^- - V_{th}^0 \pm \frac{P_r}{C_f} \right) \right\}$$

As can be seen from the above, a current $I_d$ varies with four parameters, gate voltages $V_{gs}^+$, $V_{gs}^-$, polarization +$P_r$ and –$P_r$. FIGS. 4A, 4B, 4C and 4D represent such phenomena. In detail, FIG. 4A shows a $I_{DS}$-$V_{gs}$ characteristic due to a difference between polarizations "1" and "0", FIG. 4C shows a case where two voltages $V_{gs}^+$ and $V_{gs}^-$ are applied as $V_{gs}$ when the polarization is "1" (downward), and FIG. 4D is a case where the polarization is "0" (upward).

When reading out of data is carried out in the above circumstances, the following limitation is required to achieve a non-destructive read out. That is, the voltage applied to the ferroelectric must be limited to a level with which the deterioration of data due to the disturbance pulse shown in FIG. 3F can be avoided.

For example, it is assumed that the data (voltage) which deteriorated by 50% after $10^{10}$ times of repetitive pulses is 0.3 times of Vc, and therefore the voltage substantially applied to the ferroelectric must be set to 0.3 Vc or less. $V_{gs}^{+,-}$ should satisfy the following relationship:

$$0 < V_{gs}^{+,-} < \text{constant} \times 0.3 Vc$$

where the constant presents the ratio of voltage $V_{gs}$ and a voltage applied on the ferroelectric, and is usually 1 to 3. Further, the relationship between $V_{gs}^{+,-}$ and $V_c$ is as shown in FIG. 4B.

In an actual memory cell, there are six possible states depending upon the selection state of the memory cell as shown in FIG. 4E, that is, $S^1$, $HS^1$, $US^1$, which are "1" polarization states, S indicating the selected state, HS indicating the half selected state, with selection of either X or Y, and US indicating the unselected state, and $S^0$, $HS^0$, $US^0$, which are "0" polarization states. The voltages applied to a memory cell are deteriorated by the ½ $V_W$ mode, ⅓ $V_W$ mode and ⅓ $V_W$ mode. In the ½ $V_W$ mode, the voltage $V_{gs}$ applied to a memory cell is expressed as:

$$V_{gs}^{(S)} = V_R$$

$$V_{gs}^{(HS)} = \tfrac{1}{2} V_R$$

$$V_{gs}^{(US)} = 0$$

in the ⅓ $V_W$ mode, it is expressed as:

$$V_{gs}^{(S)} = V_R$$

$$V_{gs}^{(HS)} = \tfrac{1}{3} V_R$$

$$V_{gs}^{(US)} = \tfrac{1}{3} VR$$

where $V_R$ represents a voltage applied to the cell, and 0 or $\pm \tfrac{1}{2} V_R$ are applied to each line in the ½$V_W$ mode, whereas 0, $V_R$ or $\pm \tfrac{1}{3} V_R$ are applied to each line in the ⅓$V_W$ mode. Such cases are similar to those shown in FIGS. 3C and 3D. When the state is set back to that shown in FIG. 4E, the voltages are set in the order as follows:

$$V_{gs}^{(S)} > V_{gs}^{(HS)} \geq V_{gs}^{(US)}$$

Further, since the relationship $$V_{gs}^{(S^1)} > V_{gs}^{(S^0)}$$

is established, a cell having a "1" polarization and being selected will have the most $I_{DS}$ flow, and setting a sufficient difference from the state of $HS^1$ or $S^0$. Thus, the number of memory cells which can be connected to the same data line can be increased.

Next, in order to achieve the non-destructive read out, a large voltage cannot be applied between the source and the drain. The voltage must be set in accordance with the deterioration characteristic determined in FIG. 3F, and here, it must be set about 0.3 times or less.

The control of each of voltages $V_W$, $V_r$, $Vg_s$, $V_c$ and the like applied to the X data line, Y data line, gate electrode, source-drain electrode and the like, is carried out by driving voltage control means (not shown), and driving voltages respectively corresponding to ½$V_W$ mode and ⅓$V_W$ mode are applied.

The method of driving a ferroelectric memory, according to the second embodiment of the present invention will now be described with reference to FIGS. 5 and 6.

Figure 5:
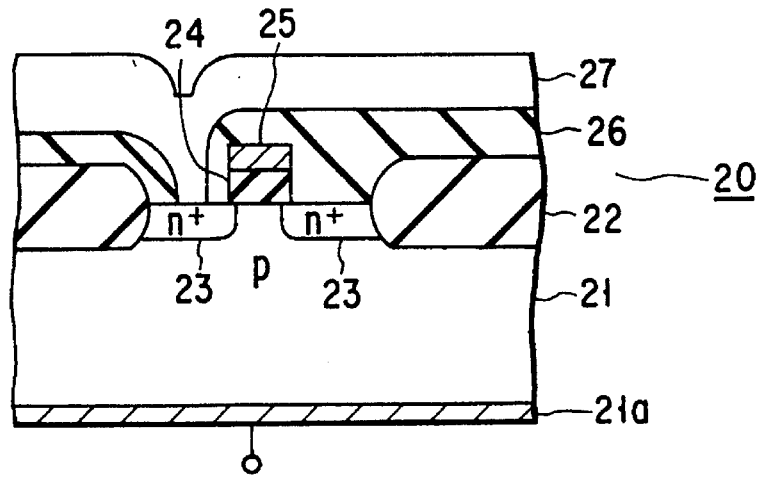
FIG. 5 is a diagram showing a lamination structure of a ferroelectric memory cell, designed to illustrate a method of driving a ferroelectric memory, according to the second embodiment.

FIG. 5 is a diagram showing a cross section of a ferroelectric memory cell. As shown in FIG. 5, a window is formed on a p-type semiconductor substrate 21 so as to be surrounded by a field oxide film 22, and an $n^+$ type source/drain region 23 is formed in a pre-determined region to be exposed by ion implantation or the like. Further, a ferroelectric film 24 is formed, and a gate electrode 25 is formed to overlie thereon. Subsequently, an insulation layer 26 is formed on the entire surface, and then a portion of the layer 26 is removed so as to expose the source/drain region by selective etching. A wiring layer made of conductor is formed on the exposed source/drain region 23. FIG. 6 shows a structure including peripheral circuits, as an example of arrangement of the memory cell.

Figure 6:
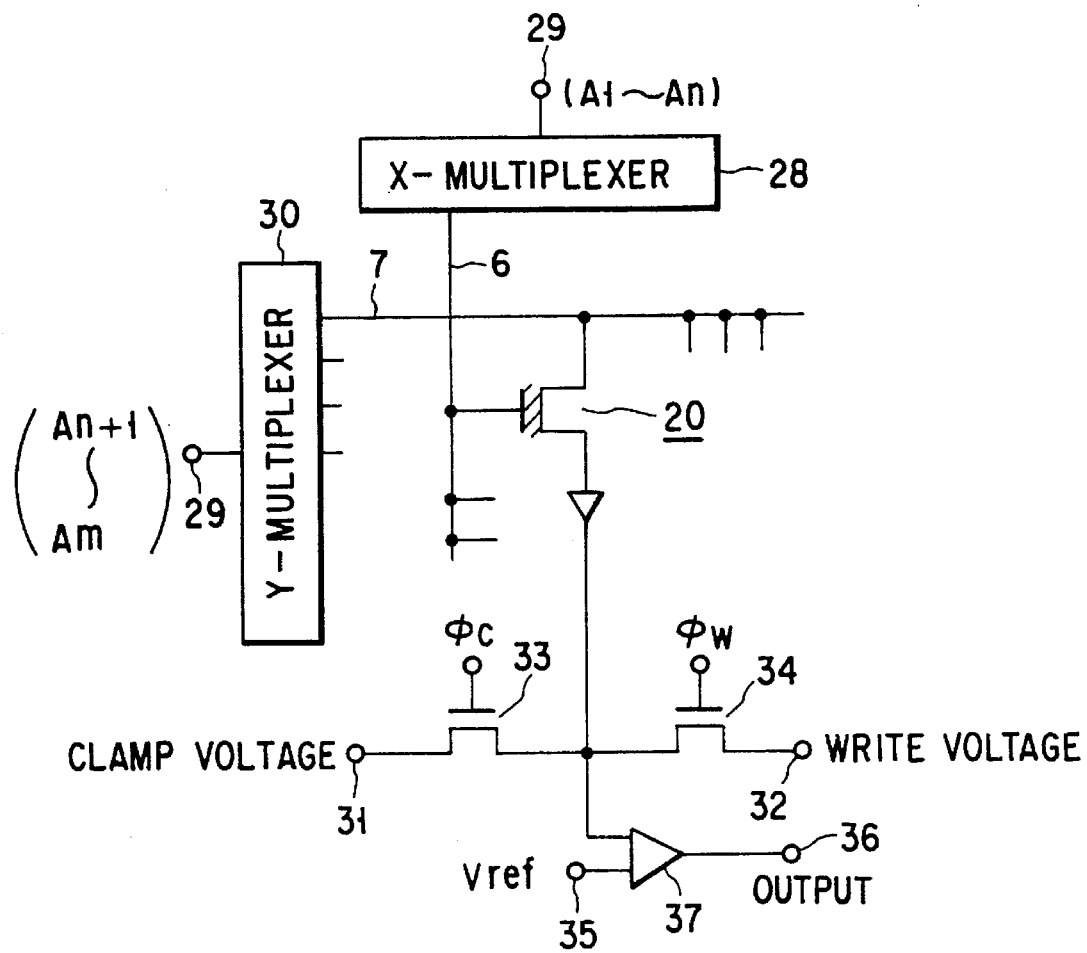
FIG. 6 is a diagram showing an example of configuration including a ferroelectric memory cell shown in FIG. 5 and arranged in a matrix, and peripheral circuits.

In FIG. 6, $A_1$-$A_n$ and $A_{n+1}$-$A_m$ 29 each represent an address, and data supplied to a memory cell designated via X and Y multiplexer 28 and 30 are output from a common line, and a clamp voltage $V_{clamp}$ 31 or a write voltage $V_{write}$ 32 selected by turning ON/OFF of a transistor $\phi_C$ or a transistor $\phi_W$ is input to the sense amplifier 37. $V_{ref}$ 35 may be applied as an voltage, or a dummy cell may be used.

Figure 7:
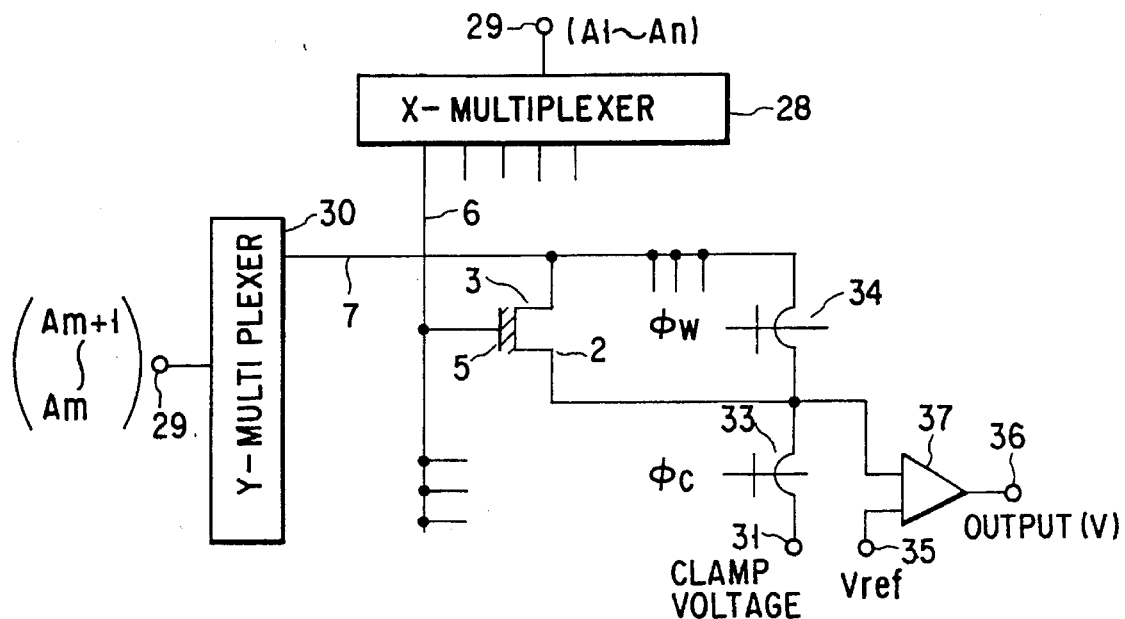
FIG. 7 is a diagram showing a structure including peripheral circuits, designed to illustrate a method of driving a ferroelectric memory, according to the third embodiment.

The method of driving a ferroelectric memory according to the third embodiment of the present invention will now be described with reference to FIG. 7.

The ferroelectric memory of the third embodiment has substantially the same device structure as those shown in FIGS. 5 and 6, except that a transistor which can serve as a switch $\phi_W$ 34 for maintaining the potential of the source 2 and the drain 3 the same during writing is provided. A clamp signal 31 is a signal applied during writing, which turns on the transistor. Thus, the data line 6 which is connected to the source is fixed to the clamp signal, and the signal is guided to a sense amplifier 37.

The method of driving a ferroelectric memory according to the fourth embodiment of the present invention will now be described with reference to FIG. 8.

In the ferroelectric memory of the fourth embodiment, a potential difference between the source 2 and drain 3 is important, and Vth must be controlled by a channel dope.

Figure 8:
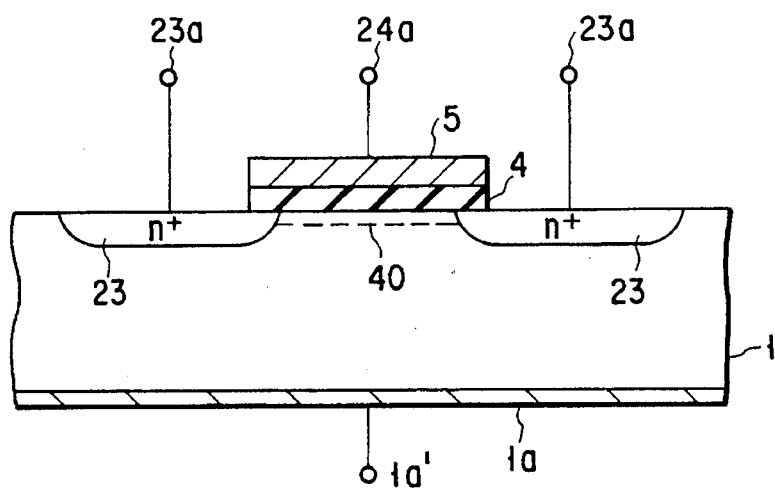
FIG. 8 is a diagram showing a lamination structure of a ferroelectric memory cell, designed to illustrate a method of driving a ferroelectric memory, according to the fourth embodiment.
Figure 10A:
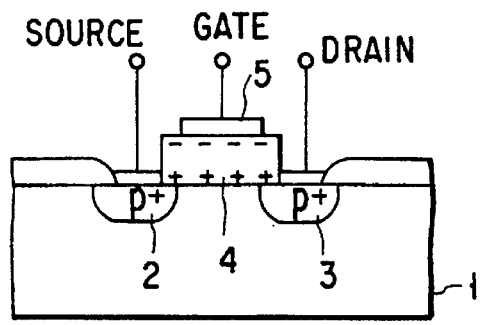
FIGS. 10A, 10B and 10C are diagrams showing a basic structure of a conventional F gate FET.
Figure 10B:
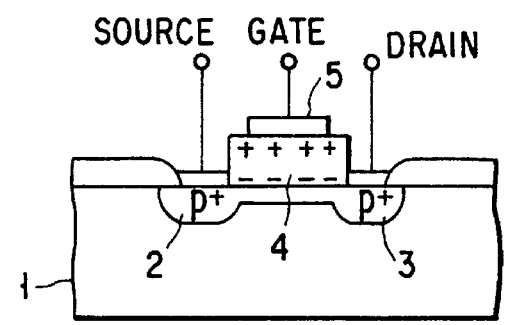
Figure 10C:
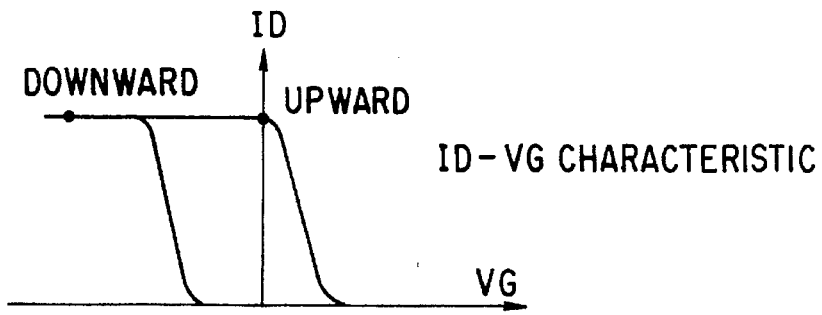
Figure 11:
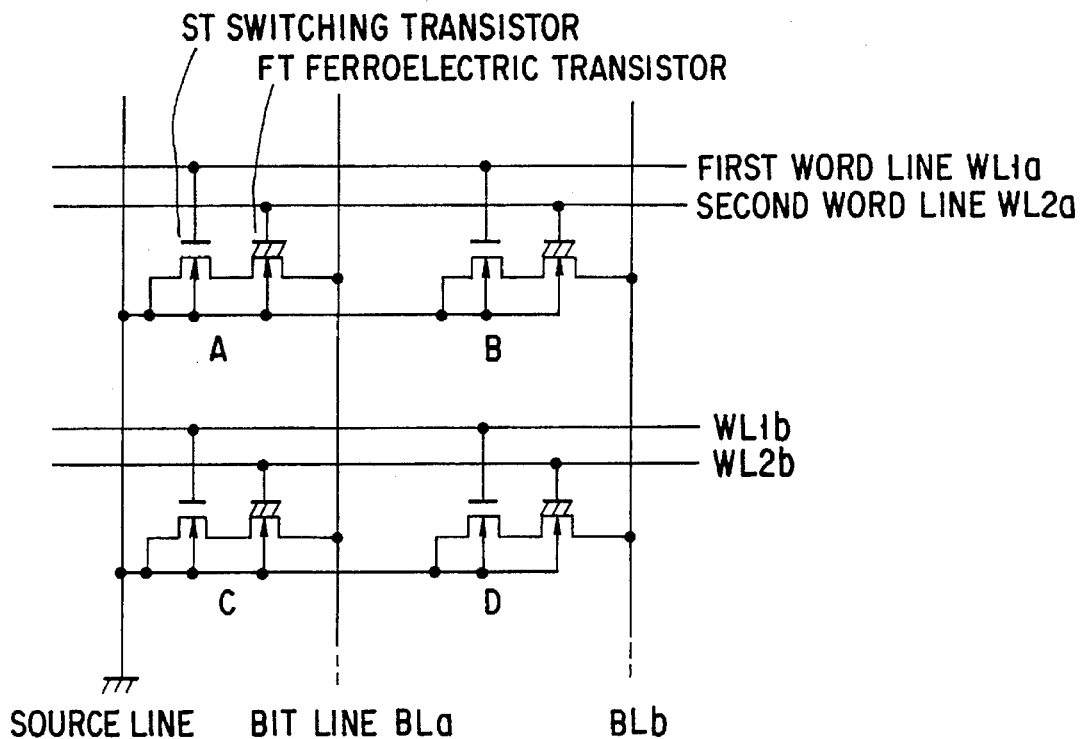
FIG. 11 is a diagram showing an example of the structure of a memory device in which a conventional F gate FET is employed.
Figure 12:
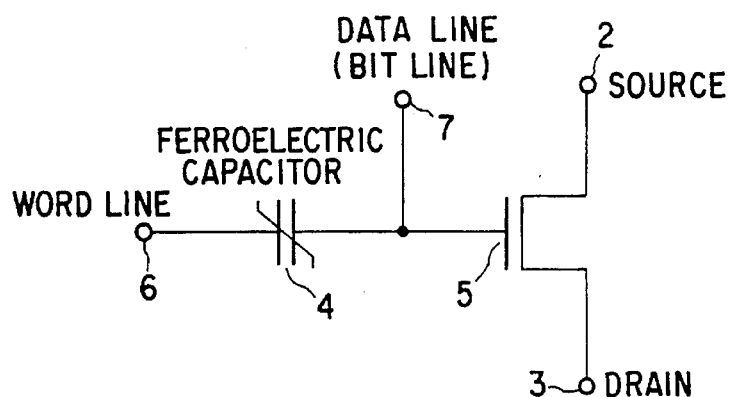
FIG. 12 is a diagram showing an example of the structure of a memory device in which a conventional F gate FET is employed.

As shown in FIG. 8, an $n^+$-type channel dope is carried out on a p-type low-concentration substrate, so as to form a channel region 40. The $n^+$-type channel region is controlled by channel ion injection so as to make the concentration and depth correspond to each other. It is desirable that the concentration of the $p^-$ well region should be about $10^{14}$ to $10^{16}$ cm$^{-3}$ and that of the channel region 40 be about $10^{16}$ to $10^{19}$ cm$^{-3}$. With these concentrations, when the gate voltage is close to 0 V, a channel is formed, thus equalizing the potentials of the source and drain 2 and 3. As a negative voltage is applied, the channel is made non-conductive.

The method of driving a ferroelectric memory according to the fifth embodiment of the present invention will now be described with reference to FIG. 9.

With regard to the ferroelectric memory of the fifth embodiment, in order to maintain the source 2 and drain 3 at the same potential during writing, it is preferable that the concentration of the $p^-$ well region be lowered. However, if the concentration of the $p^-$ well region 1 is reduced, the withstand voltage cannot be maintained.

As a solution to this problem, a p region 62 having a relatively high concentration is provided between a $p^-$ well region located directly underneath the channel and a $p^-$ well region 21 in this embodiment. It is desirable that the concentration of the $p^-$ well region 21 is about $10^{13}$ to $10^{16}$ cm$^{-3}$ and that of the $p^-$ well region 61 is about $10^{16}$ to $10^{18}$ cm$^{-3}$.

As described, according to the embodiments, a non-volatile memory capable of a high integration and a non-destructive read out can be achieved. Therefore, a SRAM or DRAM constituted by a ferroelectric gate transistor memory cell of non-destructive non-volatile memory, can operate in a similar writing, erasing or reading time to the regular type.

The ferroelectric memory having the above-described structure is made of one F gate FET/1 memory cell, and has a very high density. Further, writing, erasing or reading of data can be performed at a low voltage by the non-destructive read out, and thus a non-volatile memory which can withstand substantially an infinite number of times of read out, can be achieved.

As described in detail, according to the present invention, there can be provided a ferroelectric gate transistor memory device and a method of driving a ferroelectric gate transistor memory cell which can be a non-volatile memory, which can realize a high density by using a single F gate FET in one memory cell, carry out a writing at a low voltage of 5 V or 3 V as used in general ICs or semiconductor memories, and is capable of non-destructive read out.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of driving a ferroelectric memory, wherein the memory comprises a plurality of memory cells arranged in a matrix form, each of said memory cells including a ferroelectric gate transistor, each of said ferroelectric gate transistors including a source and a drain both made of a second conductivity type semiconductor and both formed on a substrate of a first conductivity type semiconductor, a ferroelectric thin film formed between the source and drain, and a conductive gate electrode formed over the ferroelectric thin film, the method comprising the steps of:

arranging said ferroelectric gate transistors of the respective memory cells so as to have only two terminals, one of said two terminals being said gate electrode, and another of said two terminals being one of said source, drain, and a source-drain, and said memory cells being arranged so as to be in a simple matrix; and applying a voltage of a predetermined range to said only two terminals of said memory cells so that a voltage applied to a memory cell other than a memory cell selected from said matrix of said memory cells is smaller than a voltage applied the selected cell.

2. A method of driving a ferroelectric memory according to claim 1, wherein said voltage applying step comprises:

supplying a writing voltage $V_w$;

applying a voltage $\frac{1}{2} V_w$ to one of terminals of the selected memory cell;

applying a voltage $-\frac{1}{2} V_w$ to another of the terminals of the selected memory cell; and applying a voltage 0 $V_w$ to both terminals of a non-selected memory cell so that a voltage applied to other memory cells is $\frac{1}{2} V_w$ when a voltage supplied to the selected memory cell is $V_w$.

3. A method of driving a ferroelectric memory according to claim 1, wherein said voltage applying step comprises:

supplying a writing voltage $V_w$;

applying a voltage 1 $V_w$ to one of terminals of the selected memory cell;

applying a voltage 0 $V_w$ to another of the terminals of the selected memory cell;

applying a voltage $\frac{1}{3} V_w$ to one of terminals of a non-selected memory cell; and applying a voltage $\frac{2}{3} V_w$ to another terminal of the non-selected memory cell, so that a voltage applied to other memory cells is $\frac{1}{3} V_w$ when a voltage supplied to the selected memory cell is $V_w$.

4. A method of driving a ferroelectric memory according to claim 1, further comprising supplying a coercive voltage $V_c$; and wherein, when data recorded in said memory cell is read out, applying one of (i) a voltage lower than the coercive voltage $V_c$ between said two terminals, and (ii) a voltage with which a voltage applied to said ferroelectric becomes lower than a coercive voltage, so as to non-destructively read out the data.

5. A method of driving a ferroelectric memory according to claim 4, wherein said voltage applying step comprises:

supplying a writing voltage $V_w$;

applying a voltage $\frac{1}{2} V_w$ one of terminals of the selected memory cell;

applying a voltage $-\frac{1}{2} V_w$ to another of the terminals of the selected memory cell; and applying a voltage 0 $V_w$ to both terminals of a non-selected memory cell so that a voltage applied to other memory cells is $\frac{1}{2} V_w$ when a voltage supplied to the selected memory cell is $V_w$.

6. A method of driving a ferroelectric memory according to claim 4, wherein said voltage applying step comprises:

supplying a writing voltage $V_w$;

applying a voltage 1 $V_w$ to one of terminals of the selected memory cell;

applying a voltage 0 $V_w$ to another of the terminals of the selected memory cell;

applying a voltage $\frac{1}{3} V_w$ to one of terminals of a non-selected memory cell; and applying a voltage $\frac{2}{3} V_w$ to another terminal of the non-selected memory cell, so that a voltage applied to other memory cells is $\frac{1}{3}$ vw when a voltage supplied to the selected memory cell is $V_w$.

7. A ferroelectric memory device comprising:

a plurality of memory cells, each of said memory cells including:

(a) a pair of impurity regions formed on a substrate;

(b) a ferroelectric thin film formed on a region located between the impurity regions of said pair of impurity regions; and (c) a gate electrode formed on the ferroelectric thin film;

word lines to which gate electrodes of at least some of the memory cells are electrically connected;

first data lines to which one of the pair of impurity regions of each of the memory cells connected to the words lines is connected;

second data lines to which another one of the pair of impurity regions of each of the memory cells connected to the first data lines is connected; and switching means for selectively connecting the first add second data lines.

8. The ferroelectric memory device of claim 7, further comprising:

voltage-applying means for clamping the first data lines at a predetermined potential when the memory cells connected thereto are selected for data writing, and wherein said switching means electrically connects the first and second data lines together at a time of data writing.

9. The ferroelectric memory device of claim 8, wherein, when a voltage applied to one selected memory cell is represented by $V_w$, said voltage-applying means applies a voltage of ½ $V_w$ to the first data line connected to the selected memory cell, said voltage-applying means applies a voltage of –½ $V_w$ to the second data line connected to the selected memory cell, and said voltage-applying means applies a voltage of 0 $V_w$ to both the first and second data lines connected to non-selected memory cells, whereby a voltage of ½ $V_w$ is applied to the non-selected memory cells.

10. The ferroelectric memory device of claim 8, wherein, when a voltage applied to one selected memory cell is represented by $V_2$, said voltage-applying means applies a volume of 1 $V_w$ to the first data line connected to the selected memory cell, said voltage-applying means applies a voltage of 0 $V_w$ to the second data line connected to the selected memory cell, said voltage-applying means applies a voltage of ⅓ $V_w$ to the first data lines connected to non-selected memory cells, and said voltage-applying means applies a voltage of ⅔ $V_w$ to the second data lines connected to the non-selected memory cells, whereby a voltage of ⅓ $V_w$ is applied to the non-selected memory cells.

11. The ferroelectric memory device of claim 8, wherein, when information is read out from the memory cells, said voltage-applying means applies a voltage lower than a coercive voltage $V_c$ between the first and second data lines, so as to read out the information non-destructively.

12. The ferroelectric memory device of claim 11, wherein, when a voltage applied to one selected memory cell is represented by $V_w$, said voltage-applying means applies a voltage of ½ $V_w$ to the first data line connected to the selected memory cell, said voltage-applying means applies a voltage of –½ $V_w$ to the second data line connected to the selected memory cell, and said voltage-applying means applies a voltage of 0 $V_w$ to both the first and second data lines connected to non-selected memory cells, whereby a voltage of ½ $V_w$ is applied to the non-selected memory cells.

13. The ferroelectric memory device of claim 11, wherein, when a voltage applied to one selected memory cell is represented by $V_w$, said voltage-applying means applies a voltage of 1 $V_w$ to the first data line connected to the selected memory cell, said voltage-applying means applies a voltage of ⅓ $V_w$ to the first data lines connected to non-selected memory cells, and said voltage-applying means applies a voltage of ⅔ $V_w$ to the second data lines connected to the non-selected memory cells, whereby a voltage of ⅓ $V_w$ is applied to the non-selected memory cells.

14. The ferroelectric memory device of claim 8, wherein:

said memory cells are arranged in a matrix pattern; and at least one of the pair of impurity regions of each of said memory cells comprises one of a source region and a drain region.

15. The ferroelectric memory device of claim 7, wherein:

said memory cells are arranged in a matrix pattern; and at least one of the pair of impurity regions are each of said memory cells comprises one of a source region and a drain region.

16. A ferroelectric memory having a plurality of ferroelectric gate transistor memory cells arranged in a matrix pattern, each of said ferroelectric gate transistor memory cells comprising:

a substrate formed of a semiconductor of a first conductivity type;

a source region and a drain region which are formed on the substrate and which are of a second conductivity type;

A channel region formed of a semiconductor of said first conductivity type and which is located between the source region and the drain region;

a ferroelectric thin film formed on the channel region; and a conductive gate electrode formed over the ferroelectric thin film;

said ferroelectric gate transistor memory cells being arranged in a simple matrix structure with each of said memory cells having only two terminals, one of said two terminals being said gate electrode, and another of said two terminals being one of the source region and the drain region;

an impurity concentration of the channel region being controlled to be within a predetermined range, thereby permitting a potential difference between the source region and the drain region to be a predetermined value.

17. The ferroelectric memory of claim 16, wherein:

said source and drain regions have a well region having a concentration in the range of $10^{14}$ to $10^{16}$ cm$^{-3}$; and said channel region has a well region having a concentration in the range of $10^{16}$ to $10^{19}$ cm$^{-3}$.

18. The ferroelectric memory of claim 16, wherein a thickness of a depletion layer produced in the channel region is controlled to be 0.3 to 1.0 µm by providing a burying layer having a relatively high concentration of $10^{16}$ to $10^{19}$ cm$^{-3}$ directly underneath the source and drain regions.

* * * * *